(12) United States Patent
Herbsommer et al.

(10) Patent No.: US 8,304,903 B2
(45) Date of Patent: Nov. 6, 2012

(54) WIREBOND-LESS SEMICONDUCTOR PACKAGE

(75) Inventors: Juan A Herbsommer, Schnecksville, PA (US); George J Przybylek, South Plainfield, NJ (US); Osvaldo J Lopez, Annandale, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 189 days.

(21) Appl. No.: 12/966,132

(22) Filed: Dec. 13, 2010

(65) Prior Publication Data

US 2011/0095411 A1 Apr. 28, 2011

Related U.S. Application Data

(63) Continuation of application No. 11/464,333, filed on Aug. 14, 2006, now abandoned.

(51) Int. Cl.
*H01L 23/48* (2006.01)

(52) U.S. Cl. .................. 257/736; 257/E23.07

(58) Field of Classification Search .......... 257/736
See application file for complete search history.

(56) References Cited

U.S. PATENT DOCUMENTS

| | | | |
|---|---|---|---|
| 5,625,226 A | 4/1997 | Kinzer |
| 5,811,850 A | 9/1998 | Smayling et al. |
| 5,977,630 A | 11/1999 | Woodworth et al. |
| 6,040,626 A | 3/2000 | Cheah et al. |
| 6,075,286 A | 6/2000 | Ewer |
| 6,242,800 B1 | 6/2001 | Munos et al. |
| 6,262,489 B1 | 7/2001 | Koors et al. |
| 6,319,755 B1 * | 11/2001 | Mauri ........................ 438/119 |
| 6,396,127 B1 | 5/2002 | Munoz et al. |
| 6,404,050 B2 | 6/2002 | Davis et al. |
| 6,482,680 B1 | 11/2002 | Khor et al. |
| 6,489,678 B1 | 12/2002 | Joshi |
| D471,165 S | 3/2003 | Williams et al. |
| D472,528 S | 4/2003 | Kasem et al. |
| 6,586,824 B1 | 7/2003 | Glenn et al. |
| 6,593,622 B2 | 7/2003 | Kinzer et al. |
| 6,611,047 B2 | 8/2003 | Hu et al. |
| 6,617,655 B1 | 9/2003 | Estacio et al. |
| 6,627,976 B1 | 9/2003 | Chung et al. |
| 6,630,726 B1 | 10/2003 | Crowley et al. |
| 6,638,790 B2 | 10/2003 | Minamio et al. |
| 6,639,308 B1 | 10/2003 | Crowley et al. |
| 6,645,791 B2 | 11/2003 | Noquil et al. |
| 6,646,329 B2 | 11/2003 | Estacio et al. |
| 6,653,740 B2 | 11/2003 | Kinzer et al. |

(Continued)

OTHER PUBLICATIONS

Bai et al., "Comparative Thermal and Thermomechanical Analyses of Solder-Bump and Direct-Solder Bonded Power Device Packages Having Double-Sided Cooling Capability", IEEE, 2004, pp. 1240-1246.

*Primary Examiner* — Daniel Whalen
(74) *Attorney, Agent, or Firm* — Steven A. Shaw; W. James Brady; Frederick J. Telecky, Jr.

(57) ABSTRACT

A wirebond-less packaged semiconductor device includes a plurality of I/O contacts, at least one semiconductor die, the semiconductor die having a bottom major surface and a top major surface, the top major surface having at least two electrically isolated electrodes, and a conductive clip system disposed over the top major surface, the clip system comprising at least two electrically isolated sections coupling the electrodes to respective I/O contacts.

7 Claims, 18 Drawing Sheets

U.S. PATENT DOCUMENTS

| | | |
|---|---|---|
| 6,661,082 B1 | 12/2003 | Granada et al. |
| 6,677,663 B1 | 1/2004 | Ku et al. |
| 6,677,669 B2 | 1/2004 | Standing |
| 6,696,321 B2 | 2/2004 | Joshi |
| 6,696,747 B1 | 2/2004 | Lee et al. |
| 6,700,187 B2 | 3/2004 | Paek |
| 6,707,138 B2 | 3/2004 | Crowley et al. |
| 6,713,322 B2 | 3/2004 | Lee |
| 6,723,582 B2 | 4/2004 | Glenn et al. |
| 6,730,544 B1 | 5/2004 | Yang |
| 6,744,124 B1 | 6/2004 | Chang et al. |
| 6,753,605 B2 | 6/2004 | Joshi |
| 6,756,658 B1 | 6/2004 | Gillett et al. |
| 6,762,067 B1 | 7/2004 | Quinones et al. |
| 6,773,964 B2 | 8/2004 | Fan |
| 6,777,800 B2 * | 8/2004 | Madrid et al. ............ 257/690 |
| 6,818,973 B1 | 11/2004 | Foster |
| 6,838,309 B1 | 1/2005 | McCann |
| 6,841,414 B1 | 1/2005 | Hu et al. |
| 6,844,615 B1 | 1/2005 | Edwards et al. |
| 6,846,704 B2 | 1/2005 | Paek |
| 6,847,103 B1 | 1/2005 | Perez et al. |
| 6,853,060 B1 | 2/2005 | Seok et al. |
| 6,858,919 B2 | 2/2005 | Seo et al. |
| 6,873,041 B1 * | 3/2005 | Crowley et al. ............ 257/692 |
| 2001/0030362 A1 | 10/2001 | Grant |
| 2001/0045627 A1 | 11/2001 | Connah et al. |
| 2001/0048154 A1 | 12/2001 | Cheah et al. |
| 2001/0052639 A1 | 12/2001 | Jeon et al. |
| 2002/0008319 A1 | 1/2002 | Davis et al. |
| 2002/0066950 A1 | 6/2002 | Joshi |
| 2002/0070441 A1 | 6/2002 | Cheah |
| 2002/0135079 A1 | 9/2002 | Shivkumar et al. |
| 2002/0163040 A1 | 11/2002 | Kinzer et al. |
| 2003/0011005 A1 | 1/2003 | Joshi |
| 2003/0016505 A1 | 1/2003 | Jauregui |
| 2003/0067071 A1 | 4/2003 | Cardwell |
| 2003/0075786 A1 | 4/2003 | Joshi et al. |
| 2003/0122247 A1 | 7/2003 | Joshi et al. |
| 2004/0021233 A1 | 2/2004 | Kinzer |
| 2004/0061221 A1 | 4/2004 | Schaffer |
| 2004/0159939 A1 | 8/2004 | Joshi et al. |
| 2004/0164386 A1 | 8/2004 | Joshi et al. |
| 2004/0201086 A1 | 10/2004 | Joshi |
| 2005/0179143 A1 | 8/2005 | Moxham |

* cited by examiner

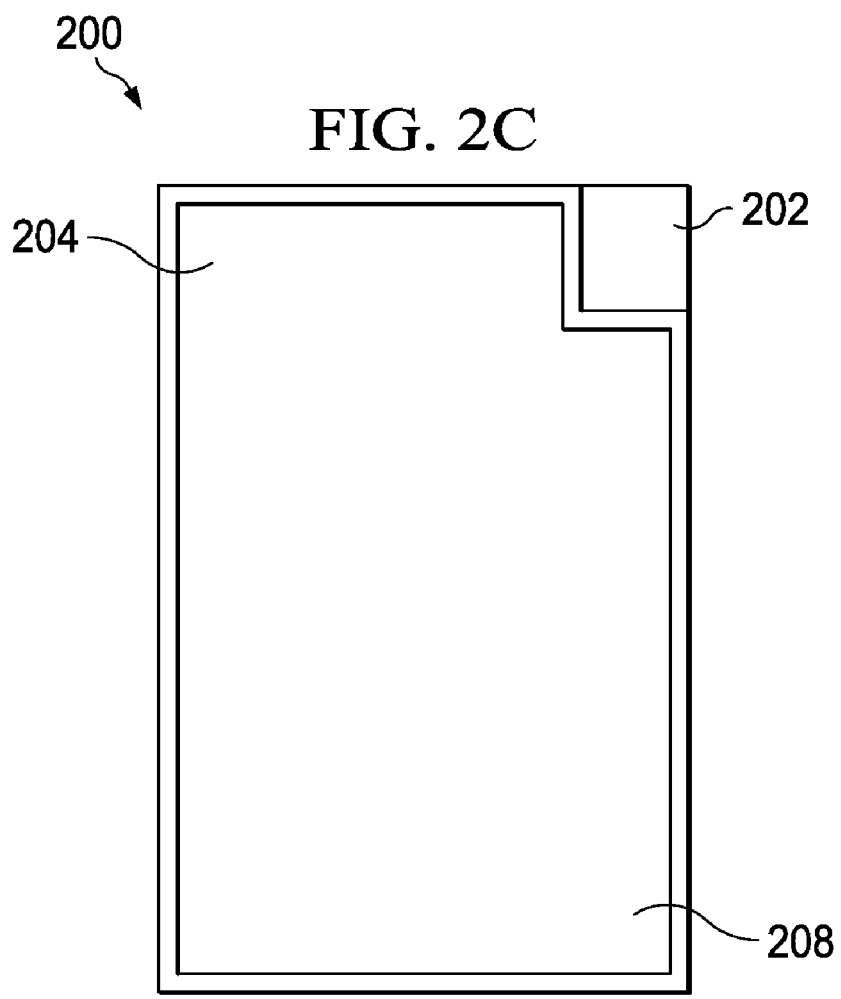

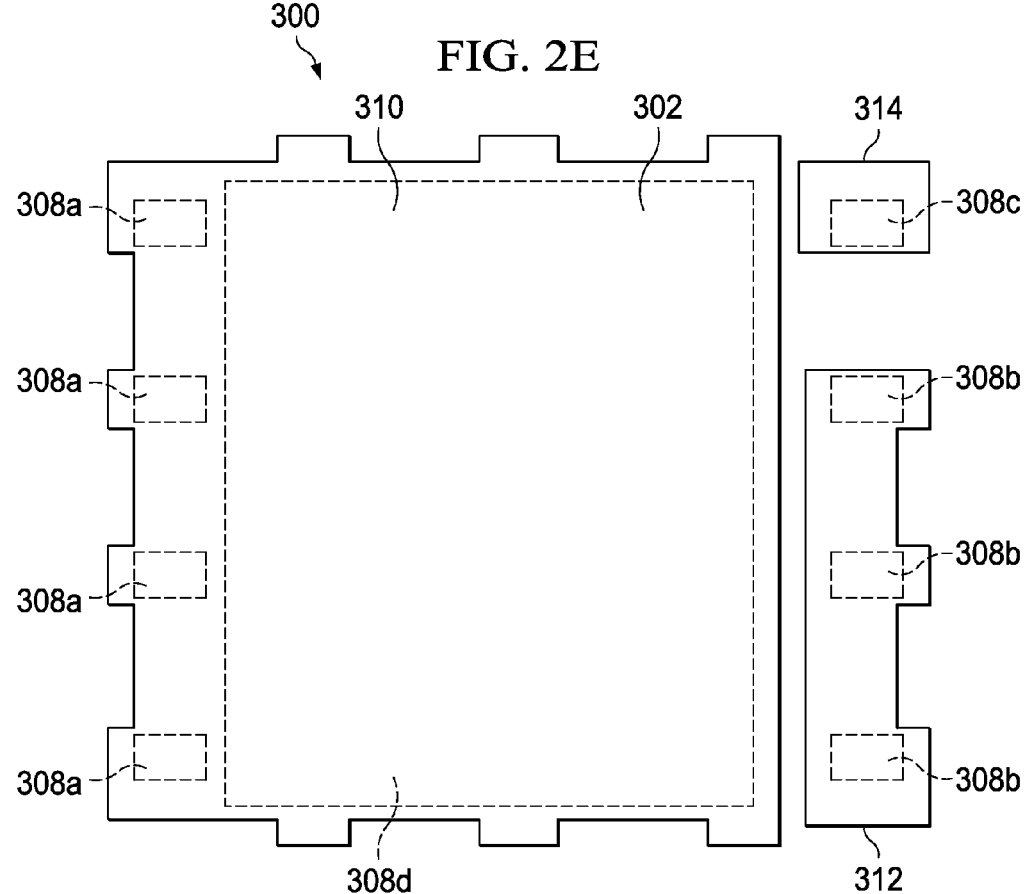
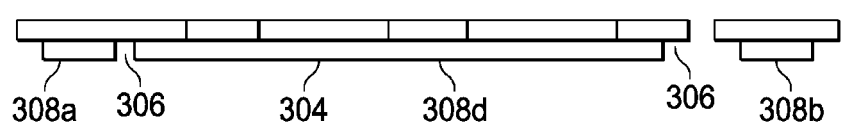

WIREBOND-LESS SEMICONDUCTOR PACKAGE

This is a continuation of application Ser. No. 11/464,333 filed Aug. 14, 2006 now abandoned, the contents of which are herein incorporated by reference in its entirety.

FIELD OF THE INVENTION

The present invention relates to packages for single or multiple semiconductor devices and in particular to packages that require very low electrical and/or thermal resistance, inductance and cost.

BACKGROUND OF THE INVENTION

It is conventional in the electronic industry to encapsulate one or more semiconductor devices in a semiconductor package. These plastic packages protect a chip from environmental hazards and handling hazards and provide a method for electrically and mechanically attaching the chip to an intended device. The demands on the package design include the ability to conduct high currents without self heating, low electrical and thermal resistances, high reliability under extreme power conditions and low parasitic inductances.

Various approaches to packaging semiconductor devices have been documented in the literature as well as commercialized in order to address these design requirements. In one such design, the contact between the backside of the packaged die to the external world is made through an attachment to a highly electrically conductive leadframe using low thermal/electrical resistance solder or epoxy. Some solutions leave the backside of the die exposed.

The topside pad of the silicon die is connected to the I/O pads of the package. This is a critical part of the package design since all the current and an important percentage of the heat flux has to be conducted through it. The industry uses a variety of solutions for this, including copper strap designs, ball wirebond and ribbon wirebond designs, and copper clip designs.

Each of these designs requires at least one or more wirebonds that at least connect one or more the device terminals to an I/O of the leadframe. Wirebond reliability is a major concern with these packages. The mismatch of coefficient of thermal expansion (CTE) between materials used inside the package causes thermal cycling that provides stresses and small deformations in the wirebonds. These cycling deformations create stress and deformations as a result of the joint fatigue and can lead to wirebond failure.

Further, the bondability of wires to the pads after the reflow of the clip is also a very important issue. In most cases, the flux present in the solder paste used to attach the clip to the semiconductor chip contaminates the pads to which the wires are to be bonded. This contamination requires special chemicals for removal and still is not easily removed. The cleaning process can involve several steps, including wet cleaning, plasma cleaning and/or UV ozone cleaning, that directly impact manufacturing costs and processing time.

Further, the use of wirebonds is limited to contacts that do not require low resistance or that conduct low currents. If this is not the case, then multiple wirebonds are needed per electrical connection, which also increases cost as well as reduces reliability. There is also an intrinsic limitation on the number of wires that can be bonded to a fixed area pad, which is determined by the capabilities of the wirebond tool.

In designs where the wirebond constitutes part of the impedance matching circuit, repeatability is a major issue. Also, wirebonds can be deformed or damaged during the manufacturing process. Wirebond solutions are not, therefore, as robust as desired and the wire profiles require constant quality checks.

Still further, wirebonds between semiconductor pads and package I/Os can result in capacitively and/or inductively coupled branches, thereby reducing electrical isolation, increasing cross talk, increased noise and instability and, in general, reducing performance under high current and high frequency operation.

There remains a need for a packaging solution that reduces device architecture and process complexity and that can be easily implemented (scaled or modified) for different semiconductor die designs or multiple die assemblies (multichip modules) without significant changes or modifications to the packaging process and machinery, and also a need to do so with very low parasitic resistance, inductance and/or thermal resistance. Still further, there remains a need for such a solution that does not utilize wirebonds.

SUMMARY OF THE INVENTION

A wirebond-less packaged semiconductor device includes a plurality of I/O contacts, at least one semiconductor die, the die having a bottom major surface and a top major surface, the top major surface having at least two electrically isolated electrodes, and a conductive clip system disposed over the top major surface, the clip system comprising at least two electrically isolated sections coupling the electrodes to respective I/O contacts.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which:

FIG. 2C is a top plan view of a semiconductor die and FIG. 2D is a side view thereof;

FIG. 2E is a top plan view of a conductive leadframe and FIG. 2F is a side view thereof;

DETAILED DESCRIPTION

Figure 1:
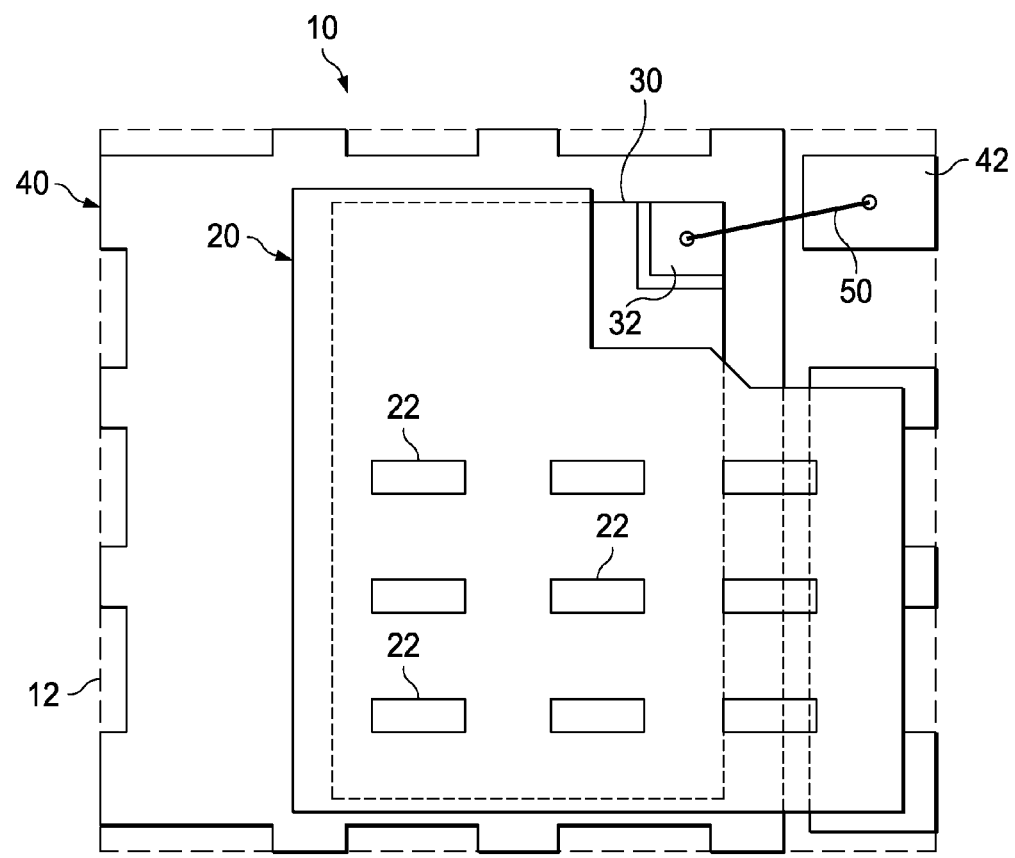
FIG. 1 is a top plan view of an assembly implementing a prior art connection scheme.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIG. 1 is a top plan view of an assembly 10 implementing a prior art connection scheme. Assembly 10 is shown prior to encapsulation to form a packaged product, the boundaries of which are illustrated by dashed line 12. The assembly 10 includes, from top to bottom, a clip system, including one or more clips, such as clip 20, a semiconductor die 30 and a leadframe 40. Portions of the die 30 and leadframe 40 hidden by clip 20 are shown in phantom. The bottom surface of the die 30 is electrically coupled to the top surface of the leadframe 40. The top surface of the die 30 is coupled to the bottom surface of the clip 20. The clip 20 includes slots or openings 22 that allow trapped gasses from the soldering operation to flow out to minimize voiding in the solder and to provide a locking mechanism for the overmolded plastic package. The lead frame 40 includes several electrically isolated sections, one of which is section 42. As illustrated in FIG. 1, the leadframe section 42 is electrically coupled to the electrode 32 of the die 30 by a wirebond 50. As described above, use of wirebond 50 for coupling the die 20 to the leadframe is undesirable as described above.

Figure 2A:
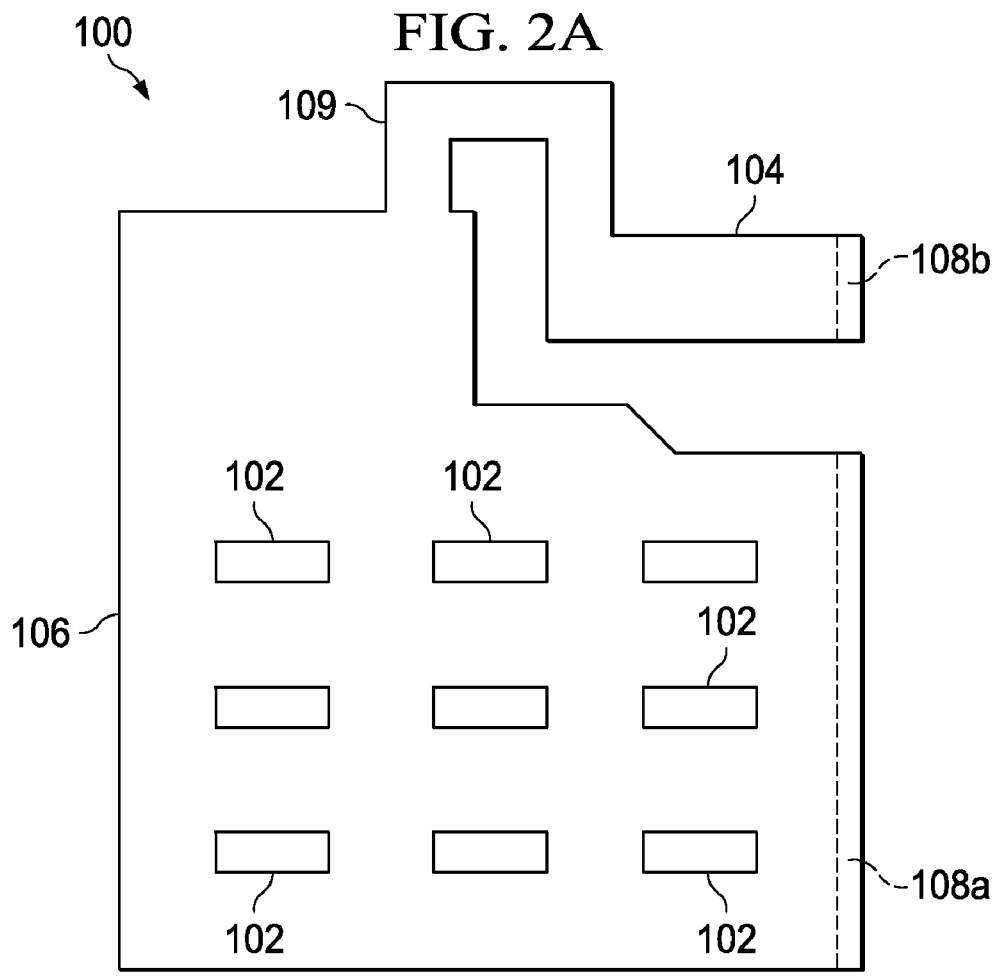
FIG. 2A is a top plan view of an exemplary conductive clip system and FIG. 2B is side view thereof.
Figure 2B:

FIG. 2A is a top plan view of one embodiment of an exemplary conductive clip 100 for use in a packaged semiconductor device. FIG. 2B is side view of the clip 100. In one embodiment, the conductive clip 100 is formed from copper, preferably from a single sheet by stamping and/or etching. In embodiments, the clip 100 includes a plurality of openings 102 formed therethrough that allow trapped gasses from the soldering operation to flow out to minimize voiding in the solder and to provide a locking mechanism for the overmolded plastic package. As best seen in FIG. 2B, clip 100 includes downwardly depending leg portions 108a, 108b, which are shown in phantom in FIG. 2A, that are configured to make contact with I/O pads of a leadframe, discussed below.

In one embodiment, the body of clip 100 forms at least main sections 104, 106 and 109. Section 106 includes downwardly depending connection leg 108a. Section 106 corresponds to (i.e., is positioned and shaped to make contact with) a first electrode from the semiconductor die, described below. Section 104 is coupled to downwardly depending connection leg 108b and corresponds to a second electrode from the semiconductor die. Finally, the third section 109 is designed to temporarily connect sections 104 and 106. Third section 109 is designed to protrude so that it can be cut or severed from a packaged product in order to electrically isolate sections 104 and 106, as described below in more detail.

FIG. 2C is a top plan view of a semiconductor die 200, and FIG. 2D is a side view thereof. As is understood by those in the art, an individual die 200 is singulated from a processed semiconductor wafer. In exemplary embodiments, the die 200 can be silicon, GaAs, SiC, GaN or other semiconductor material. In other exemplary embodiments, the die 200 can be a discrete transistor, diode, integrated circuit or other semiconductor device. In one exemplary embodiment, die 200 comprises a power MOSFET with vertical current flow. In the illustrated embodiment, the power MOSFET has two electrodes at a top major surface 208, such as a gate electrode 202 and a source electrode 204, and a third electrode, such as a drain electrode 206, (see FIG. 2D) formed at a bottom major surface 210 thereof.

As described below, the major surfaces 208, 210 are physically and electrically coupled to clip 100 and a leadframe (described below) using solder bumps (not shown) and/or a layer of conductive adhesive (collectively, "layer of conductive material"), such as PbSn solder paste or conductive silver epoxy. When die 200 is coupled to the clip 100, gate electrode 202 aligns with a portion of section 104 of the clip 100 and source electrode 204 aligns with a portion of section 106 of the clip 100. In this manner, gate electrode 202 is electrically coupled to contact leg 108b of section 104 and source electrode 204 is electrically coupled to contact leg 108a of section 106.

FIG. 2E is a top plan view of a conductive leadframe 300, and FIG. 2F is a side view thereof. Though leadframe 300 is shown in its segmented view, it should be understood that a master lead frame having a matrix of plurality of identical connection sections is typically employed, from which leadframe 300 is singulated, often after coupling to a semiconductor die or after encapsulation with a packaging material that fixes the various components with respect to the leadframe.

Leadframe 300 is formed from a single sheet of conductive material, preferably copper (Cu) or a copper alloy, such as one containing small amounts of Fe, (e.g., CDA194 or the like), electroplated or otherwise coated with a layer of solderable (and preferably corrosion resistant or corrosion minimizing (collectively, "resistant")) conductive material such as tin, gold, tin lead, silver or other solderable material. The CDA 194 copper alloy provides excellent strength, electric conductivity and thermal conductivity, and is used widely as an international standard copper alloy. The CDA194 alloy contains 2.1 to 2.8% by mass Fe, 0.015 to 0.15% P, and 0.05 to 0.20% Zn. While the top surface 302 of the leadframe 300 is planar, the bottom surface 304 has recessed region(s) designated generally at 306. The recessed region(s) 306 is preferably etched into the bottom surface 304 of the leadframe 300 to form planar I/O lead contacts 308 (shown as I/O lead contacts 308a, 308b, 308c, 308d). These contacts can be seen in phantom in FIG. 2E and in the side view of FIG. 2F. It should be understood that these lead contacts 308a, 308b, 308c, 308d are exposed in a packaged device to provide electrical contacts to the electrodes of the encapsulated die 200. Although not shown, the leadframe may also include holes formed therethrough through which the encapsulating material can flow.

Leadframe 300 includes sections that are electrically isolated from each other (once singulated from the master leadframe (not shown)). The top surface of main body section 310 aligns and couples to the drain electrode 206 of bottom major surface 210 of the semiconductor die 200. The top surface of second section 312 aligns with contact leg 108a of the clip 100, thereby making electrical contact to the source electrode 204. Finally, the top surface of third section 314 aligns with contact leg 108b, thereby making electrical contact to the gate electrode 202 of the semiconductor die 200.

Figure 2G:
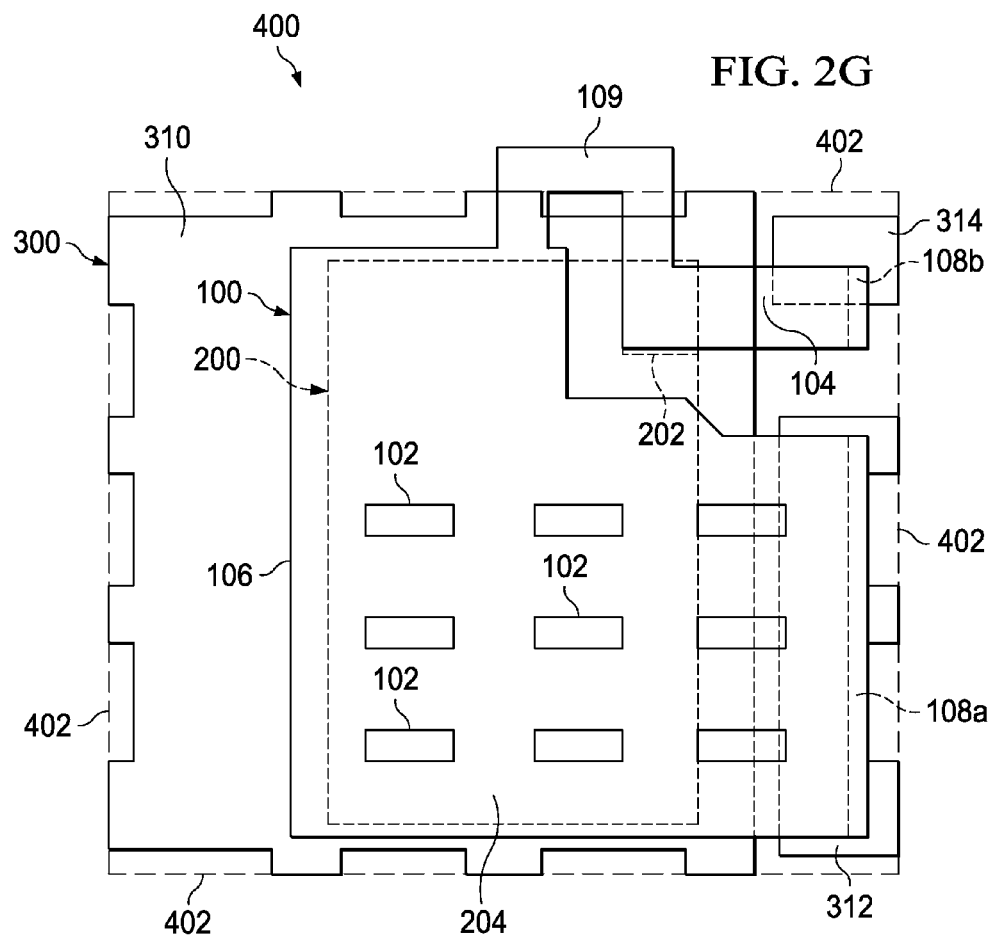
FIG. 2G is a top plan view of an assembly including a clip system, die and leadframe with hidden features and the borders of a chip package shown in phantom.
Figure 2H:
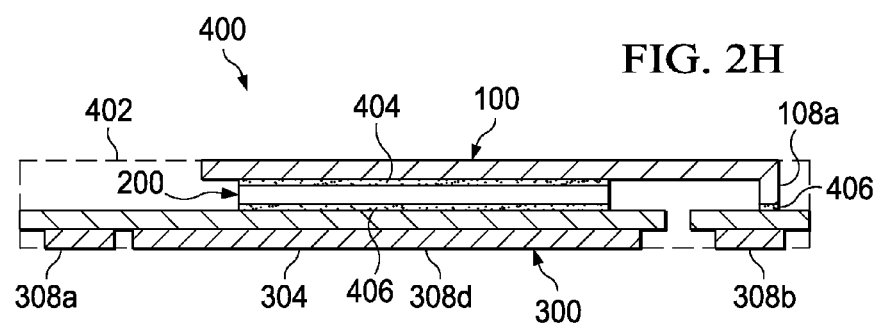
FIG. 2H is a side view of the assembly of FIG. 2G and an enlarged partial view thereof.

Turning now to FIGS. 2G and 2H, FIG. 2G is a top plan view of an assembly 400 including a clip 100 (FIGS. 2A and 2B), die 200 (FIGS. 2C and 2D) and leadframe 300 (FIGS. 2E and 2F) with features hidden by clip 100 shown in phantom. FIG. 2H is a side view of the assembly 400 of FIG. 2G and an enlarged partial view of a section thereof. Solder layer 404 couples the top surface 208 of the die 200 to the bottom surface of clip 100 and solder layer 406 couples the bottom surface 210 of the die 200 to the top surface 302 of the main body section 310 of the leadframe 300. As described above, solder bumps may be used in alternative embodiments in place of or in addition to solder layers 404 and/or 406.

Phantom line 402 shows the boundaries of the packaged device once overmolded with an encapsulating material. Lines 402 identify cut lines from where an individual packaged semiconductor device is singulated from a group of devices that are overmolded with an encapsulating material in the same process, as will be understood by those in the art. As can be seen from FIG. 2G, the section 109 of clip 100 that connects the sections 104, 106 extends beyond the border line 402. In this manner, after encapsulation, section 109 can be severed from the package, or cut, thereby electrically isolating section 104 from section 106 of clip 100, and thus electrode 202 from electrode 204 of die 200 and I/O contact lead pad 308c from contact lead pads 308b.

Figure 2I:
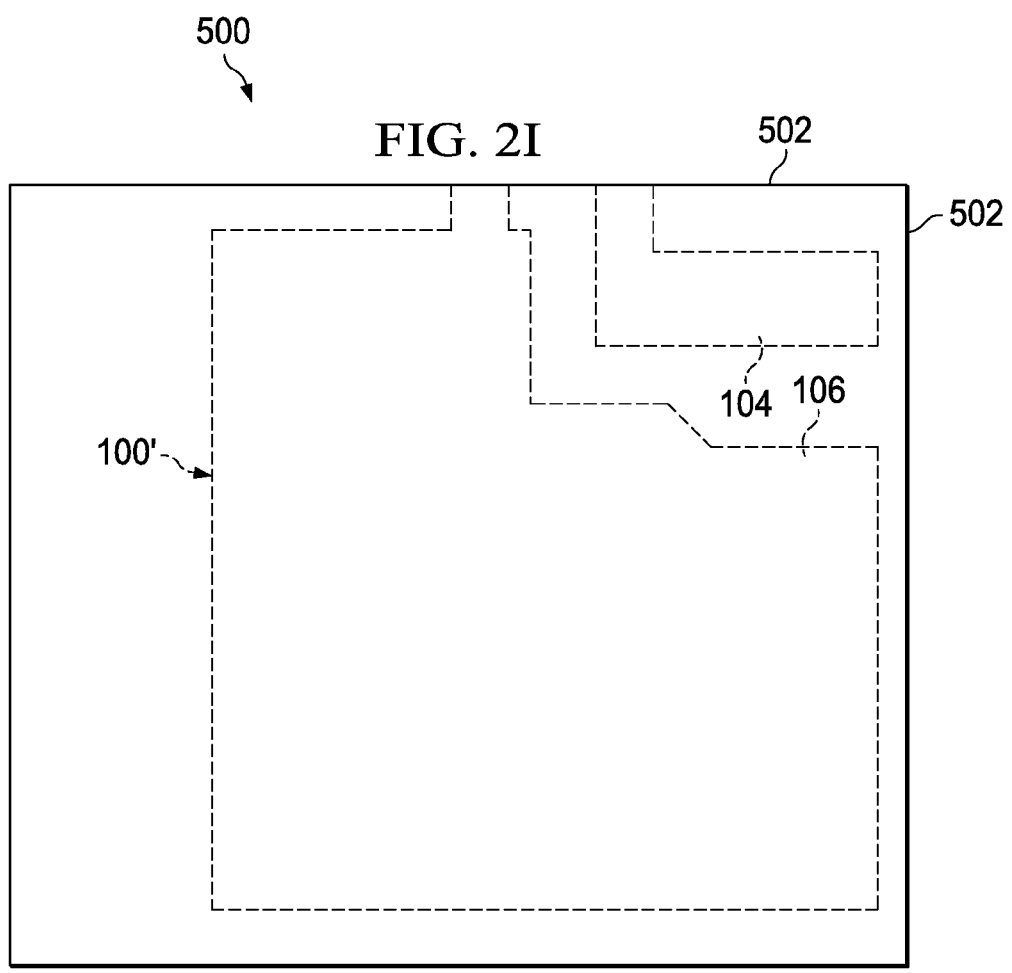
FIG. 2I is a top plan view of a packaged semiconductor device with the encapsulated clip system shown in phantom.

FIG. 2I is a top plan view of a packaged semiconductor device 500. The assembly of FIG. 2G is encapsulated with a packaging material, exposing the I/O contacts 308a, 308b, 308c and 308d at an underside thereof. In an exemplary embodiment, the encapsulating material is a plastic thermosetting material, such as CELH9220 HF 10 epoxy resin available from Hitachi Chemical, formed around the assembly by injection molding, transfer molding or other like method. For purposes of illustration, a clip 100' is shown in phantom. Clip 100' is formed by sawing or otherwise removing section 109 of clip 100, such as after an overmolding process. The edges 502 of the packaged device 500 correspond to dashed lines 402 of FIG. 2H.

Though not shown in FIG. 2I, the top surface of the clip 100' can be covered during encapsulation, leaving the top surface exposed through the encapsulation material. This embodiment provides for improved heat dissipation from the device.

Figure 6:
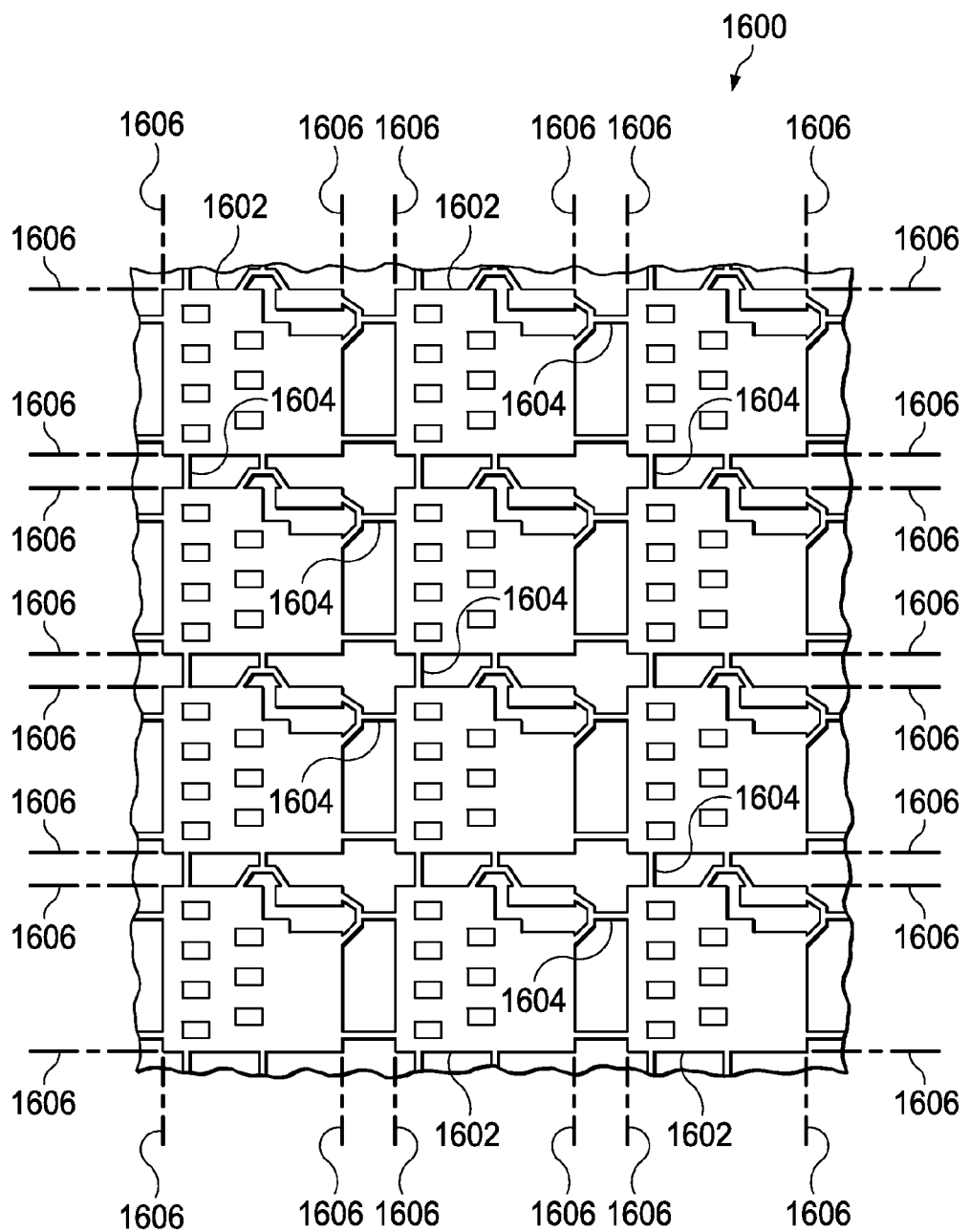
FIG. 6 is a top plan view of a matrix of connected conductive clips.

Though it is preferred that the sections 104 and 106 of clip 100 are separated from one other by severing section 109 (at least partially) from clip 100 (FIG. 2B) after the encapsulation process, so as to provide stability for clip 100 during the encapsulating step, this is not required. In embodiments where the sections are sufficiently stable on their own without being connected during the selected encapsulating process, section 109 can be sawed prior to encapsulation, or the sections 104, 106 can be provided as separate, unconnected sections. It should also be appreciated that as with leadframe 300, the clip 100 can be provided as part of a matrix of identical clip sections, such as when multiple packaged devices are formed in the same process, i.e., when multiple dies are mounted on the master leadframe, encapsulated and sawed to form individual packaged devices. In this embodiment, section 109 can be cut as part of the sawing process that singulates the packaged devices from one another. This embodiment is illustrated in FIG. 6, which shows a top plan view of a matrix 1600 of interconnected conductive clips 1602, each clip being configured as described above. Adjacent clips are coupled to each other in the matrix by connecting arms 1604. Dashed lines 1606 represent cut lines where for singulation of individual clips, either before or after coupling to a die and leadframe and/or encapsulation. An exemplary manufacturing process utilizing clip matrix 1600 includes the following steps: (a) dispensing a conductive solder paste onto a top surface of leadframe matrix of leadframes; (b) placing a plurality of silicon dies on the top surface of the leadframe matrix; (c) dispensing a conductive solder paste on the top surfaces of the silicon dies; (d) disposing the matrix 1600 of conductive clips on the top surfaces of silicon dies; (e) reflow (e.g., melting the solder using a high temperature oven); (f) overmolding the stacked structure resulting from step (e) with an encapsulating material; and (g) singulating individual device from the overmolded structure by cutting (e.g., sawing) along lines 1606.

Figure 5:
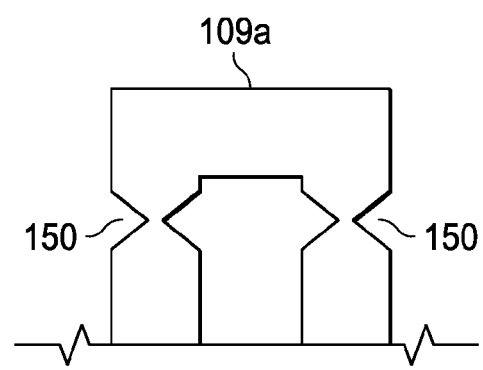
FIG. 5 is a partial view of a clip having weakened portions for facilitating removal of a section thereof.

FIG. 5 is a partial view of an alternative embodiment of a section 109a of a clip system. The section 109 includes one or more weakened regions 150 for permitting the directed breaking or snapping off of the section 109, or otherwise facilitating the separation of section 109 from the remaining portions of the clip. Sections 150 can also serve to accurately align a saw blade when sawing an unencapsulated clip.

Figure 3A:
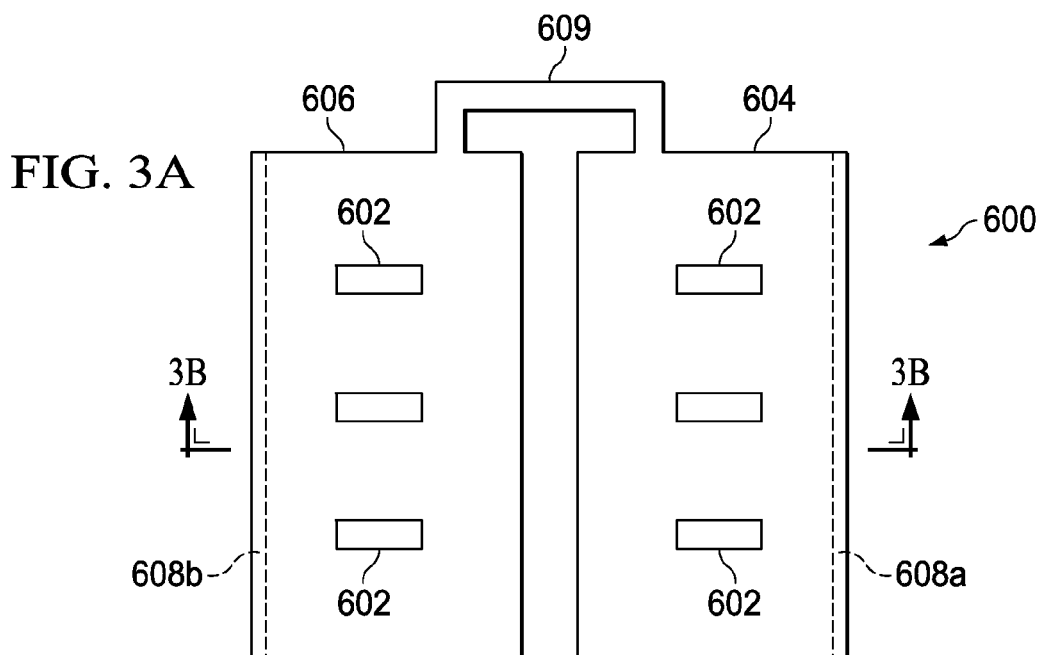
FIGS. 3A-3I illustrate the components of, and formation of, a second exemplary packaged semiconductor device.
Figure 3B:
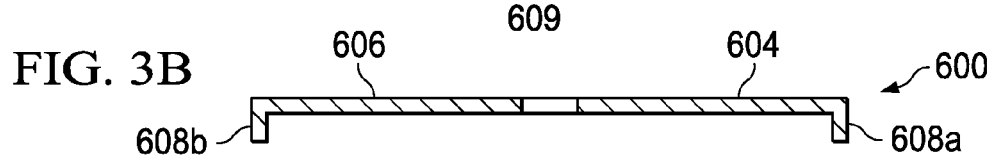

FIGS. 3A-3I illustrate components of another exemplary packaged device, as described in more detail below. FIG. 3A is a top plan view of a clip 600 configured to make an electrical connection to a die having two top electrodes that are substantially of equal size, as may be the case, for example, with an LDMOS (laterally diffused MOS) device discussed below. FIG. 3B is a cross-section of clip 600 taken along lines 3B-3B of FIG. 3A. Clip 600 includes main sections 604 and 606 coupled together by one or more protruding connecting sections 609. Openings 602 are provided through the clip 600 to function as described above. Section 604 includes downwardly depending leg 608a. Section 606 includes downwardly depending leg 608b.

Figure 3C:
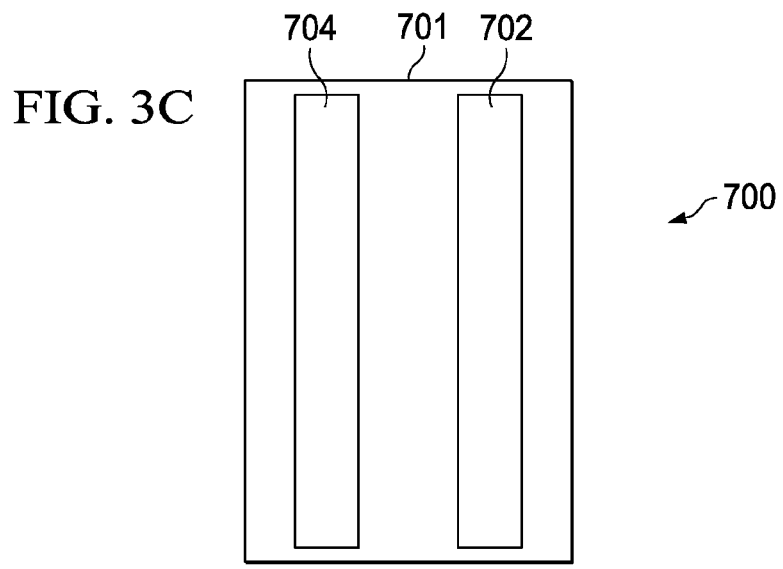
Figure 3D:
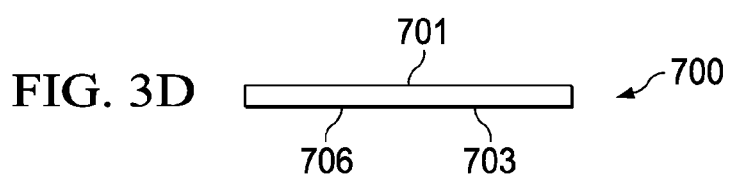

FIG. 3C is a top plan view of an exemplary die 700 and FIG. 3D is a side view thereof. Die 700 includes a top major surface 701 and a bottom major surface 703. The top major surface 701 includes two generally equally sized electrodes 702 and 704. The bottom surface 703 includes a third electrode 706. In one embodiment, the top electrodes 702, 704 correspond to the gate and drain electrodes of a LDMOS device and the bottom electrode 706 corresponds to the source of the LDMOS device.

Figure 3E:
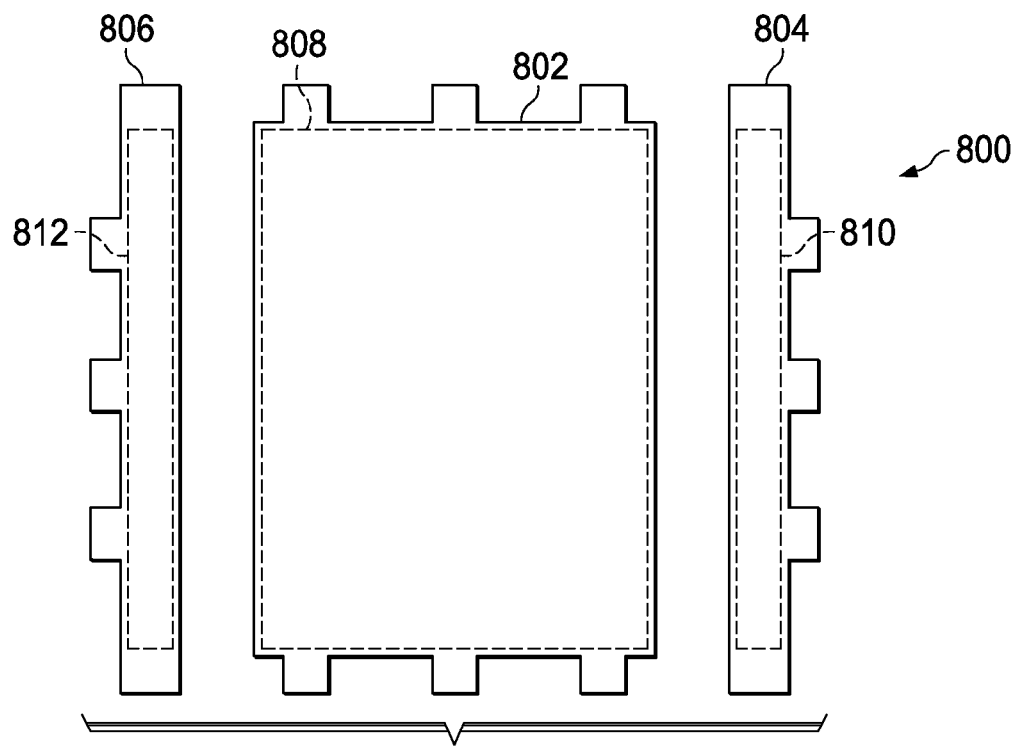
Figure 3F:
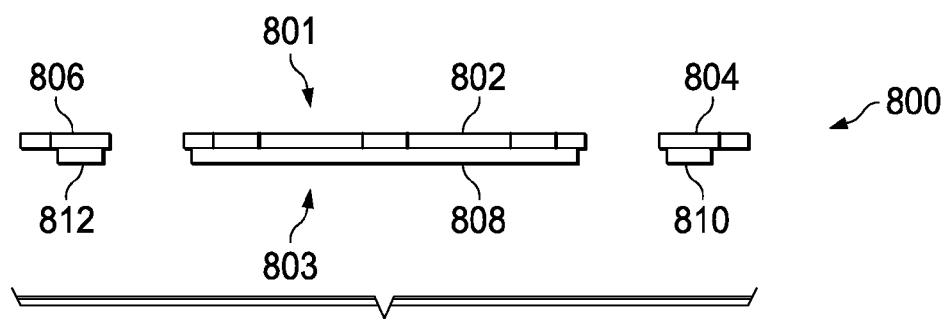

FIG. 3E is a top plan view of a leadframe 800, and FIG. 3F is a side view thereof, for making electrical connection to the semiconductor die 700 and clip 600 discussed above. The leadframe 800 has a top major surface 801 and a bottom major surface 803. The leadframe 800 is divided into three sections 802, 804 and 806 corresponding to the three electrodes of the die 700. The bottom surface of section 802 defines a contact 808, the bottom surface of section 804 defines a contact 810 and the bottom surface of section 806 defines contact 812, which are shown in phantom in FIG. 3E. The top major surface of section 802 is shaped to make contact with the bottom surface 703 of die 700, and thus with electrode 706. The top surface of section 806 is shaped to make contact with leg 608b of clip 600, and thus with electrode 704, and the top surface of section 804 is shaped to make contact with leg 608a of clip 600, and thus with electrode 702.

Figure 3G:
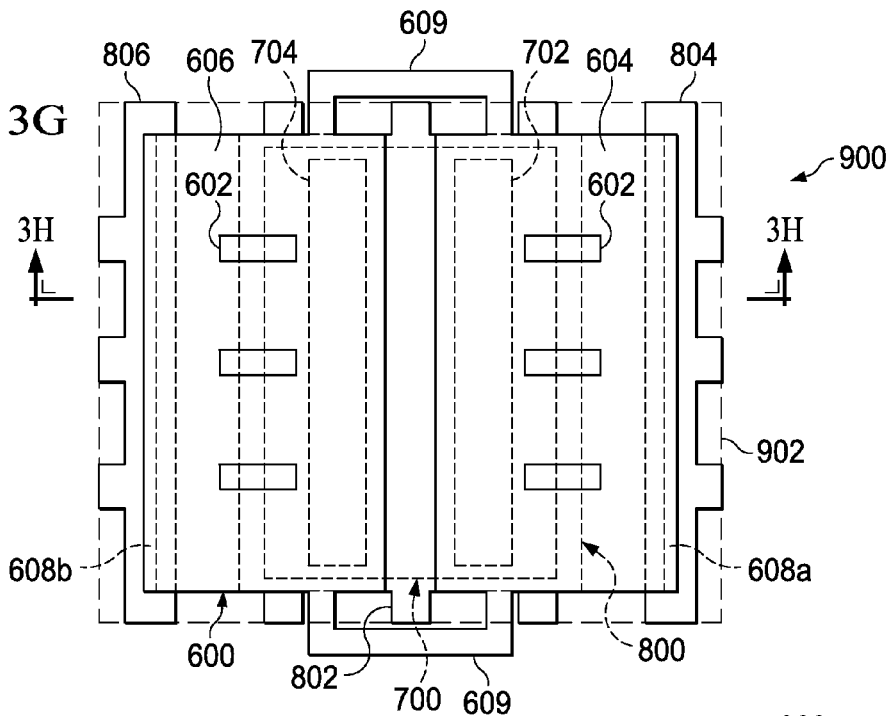
Figure 3H:
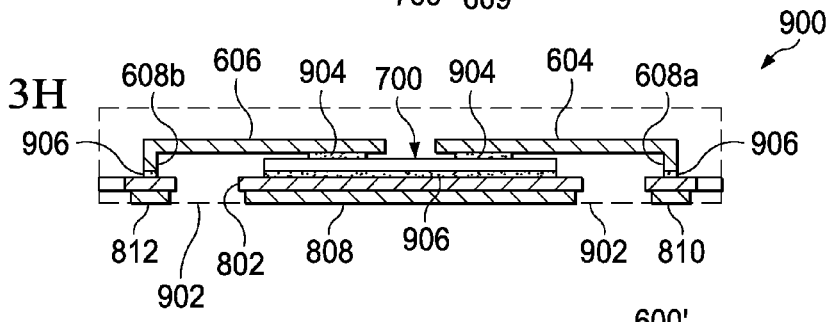

FIG. 3G is a top plan view of an assembly 900 including clip 600, die 700 and leadframe 800. FIG. 3H is a cross-sectional view of the assembly 900 taken along lines 3H-3H of FIG. 3G. Portions of the die 700 and leadframe 800 hidden by clip 600 are shown in phantom. The electrodes 702, 704 of die 700 are coupled to the bottom surface of sections 604, 606, respectively, by a layer of conductive adhesive 904 and/or solder bumps, thereby connecting the electrodes to contact pads 810, 812 through legs 608a, 608b, respectively. The bottom electrode 706 of the die 700 is coupled to the top surface of section 802 of the leadframe 800 by conductive adhesive layer 906, thereby coupling the electrode 706 to the bottom contact pad 808.

As with FIG. 2H, dashed line 902 shows the boundaries of encapsulated packaged once overmolded and singulated.

Removal of or cutting of connecting sections 609 electrically isolates clip sections 604 and 606, thereby isolating electrodes 702 and 704 and isolating contact pads 810 and 812.

Figure 3I:
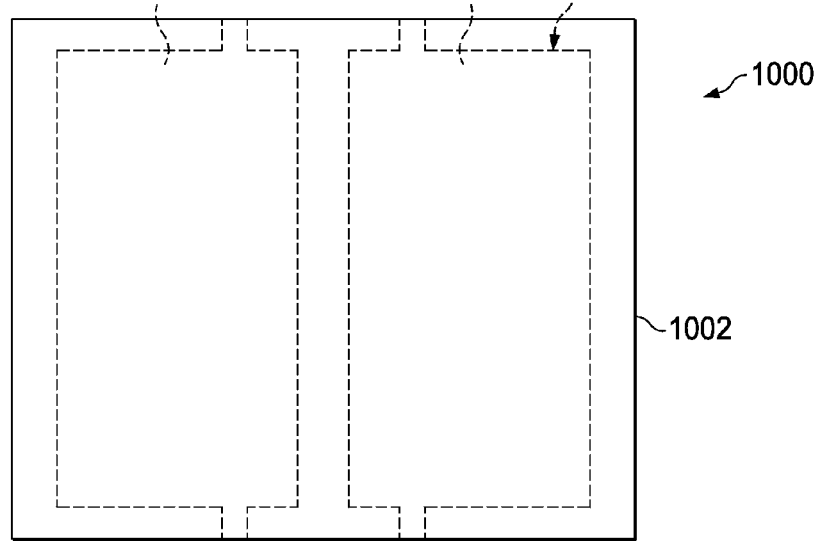

FIG. 3I is a top plan view of a packaged semiconductor device 1000. The assembly 900 of FIG. 3G is encapsulated with a packaging material, exposing the I/O contacts 808, 810 and 812 at an underside thereof. In an exemplary embodiment, the encapsulating material is a plastic thermosetting material, such as an epoxy resin described above, formed around the assembly 900 by injection molding, transfer molding or other like method. For purposes of illustration, a clip 600' is shown in phantom. Clip 600' is formed by sawing or otherwise removing of sections 609 of clip 600, such as after an overmolding process. The edges 1002 of the packaged device 1000 correspond with dashed lines 902 of FIG. 3H.

This packaging technique is especially effective in improving device performance in devices with high lateral current flow, such as with power LDMOS devices. The elimination of wirebonds allows for equal clip area to be assigned for current flow to each of the top electrodes.

Figure 4A:
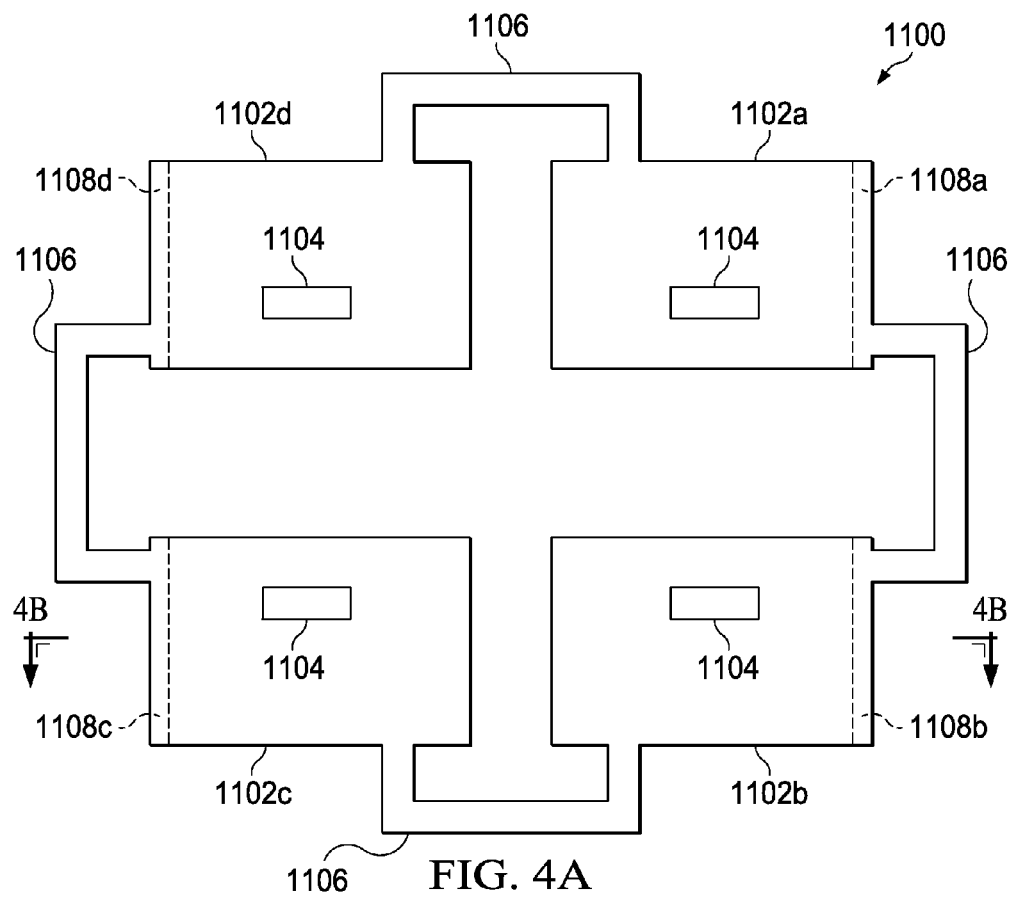
FIGS. 4A-4I illustrate the components of, and formation of, another exemplary packaged semiconductor device.
Figure 4B:
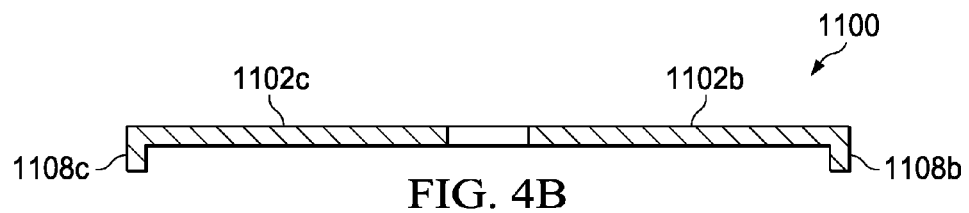

FIGS. 4A-4I illustrate components of another exemplary packaged device, as described in more detail below. FIG. 4A is a top plan view of a clip 1100 configured to make an electrical connection to a die having four top electrodes that are substantially of equal size, as may be the case, for example, with some RF transistors, Galium arsenide devices, LDMOS devices, and CMOS devices. FIG. 4B is a cross-section view of clip 1100 taken along lines 4B-4B. Clip 1100 includes four main sections 1102a, 1102b, 1102c and 1102d coupled together by a plurality of, e.g., four, connecting sections 1106. Openings 1104 are provided through the clip 1100 to function as described above. Sections 1102a through 1102d include respective downwardly depending legs 1108a through 1108d.

Figure 4C:
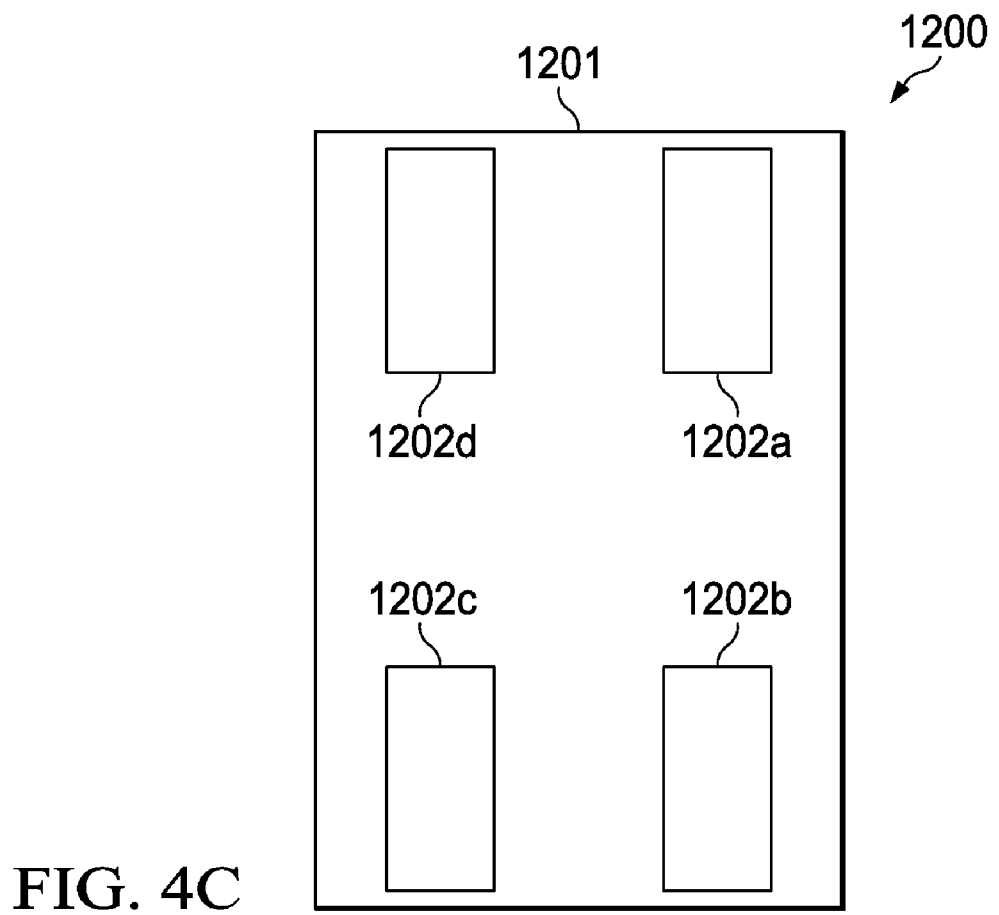
Figure 4D:
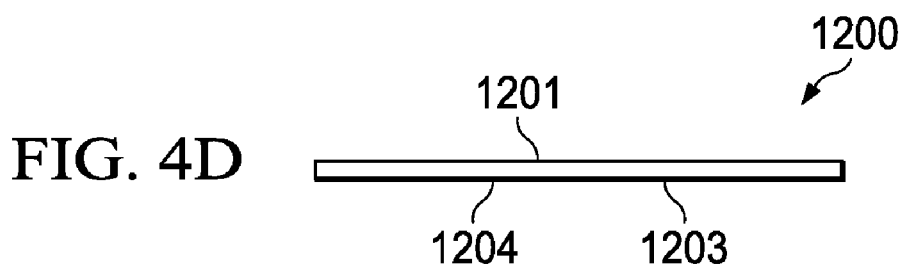

FIG. 4C is a top plan view of an exemplary die 1200 and FIG. 4D is a side view thereof. Die 1200 includes a top major surface 1201 and a bottom major surface 1203. The top major surface 1201 includes four generally equally sized electrodes 1202a, 1202b, 1202c and 1202d. The bottom surface 1203 includes a fifth electrode 1204. In one embodiment, the top electrodes 1202a, 1202b correspond to the gate electrode and electrodes 1202c, 1202d correspond to the source (or drain) electrode of a high frequency transistor device and the bottom electrode corresponds to the drain (or source) electrode of the high frequency transistor device.

Figure 4E:
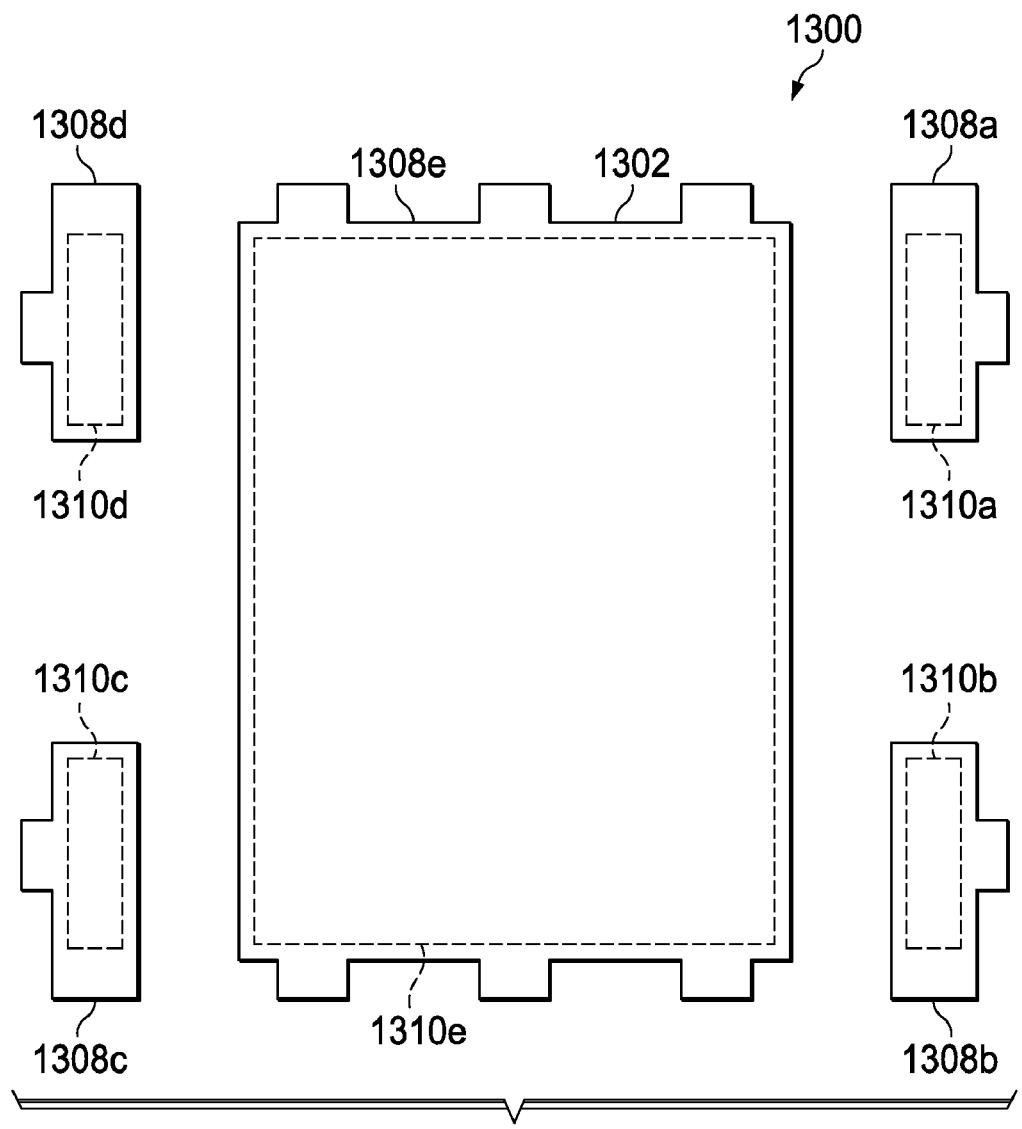
Figure 4F:
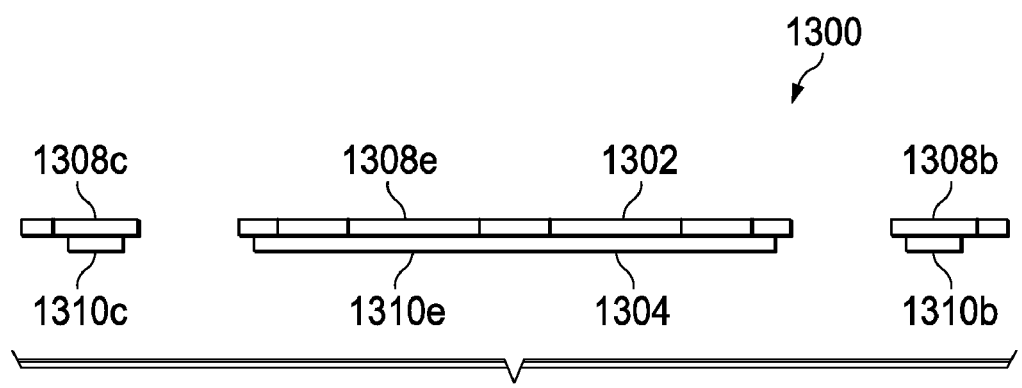

FIG. 4E is a top plan view of a leadframe 1300, and FIG. 4F is a side view thereof, for making electrical connection to the semiconductor die 1200 and clip 1100 discussed above. The leadframe 1300 has a top major surface 1302 and a bottom major surface 1304. The leadframe 1500 is divided into five sections, including a main body section 1308e and four peripheral sections 1308a to 1308d, which correspond to electrodes 1204 and 1202a-1202d, respectively, of die 1200. The bottom surface of section 1308e defines a contact 1310e, and the bottom surfaces of sections 1308a-1308d define contacts 1310a-1310d, respectively, which are shown in phantom in FIG. 4E. The top major surface of section 1308e is shaped to make contact with the bottom surface 1203 of the die 1200, and thus with electrode 1204. The top surfaces of sections 1308a to 1308d are shaped to make contact with legs 1108a to 1108d, respectively, of clip 1100, and thus to electrodes 1202a to 1202d, respectively.

Figure 4G:
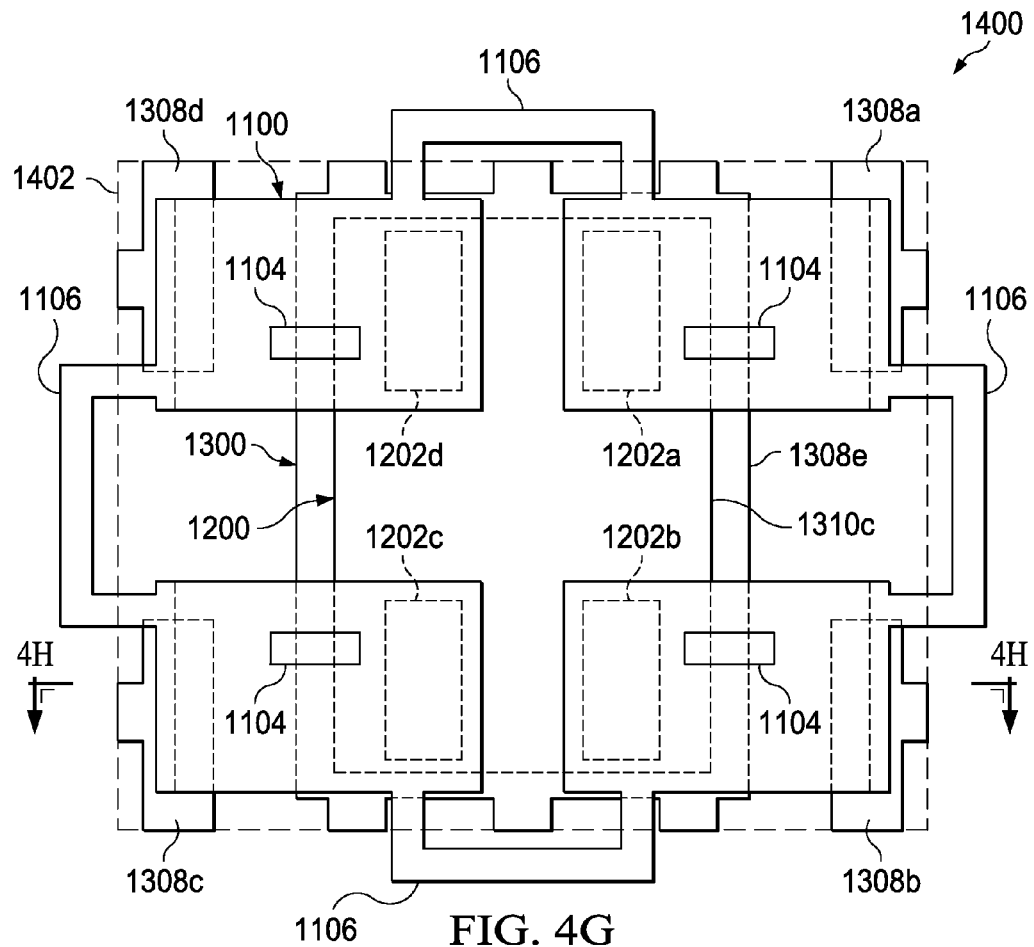
Figure 4H:
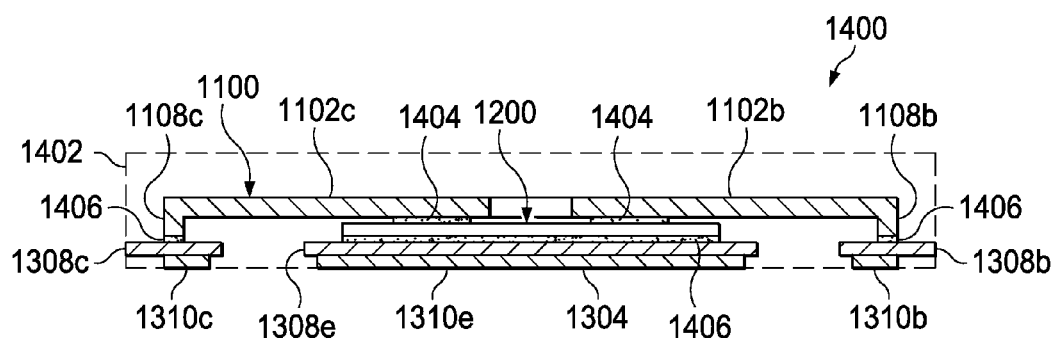

FIG. 4G is a top plan view of an assembly 1400 including clip 1100, die 1200 and leadframe 1300. FIG. 4H is a cross-sectional view of the assembly 1400 taken along lines 4H-4H of FIG. 4G. Portions of the die 1200 and leadframe 1300 hidden by clip 1100 are shown in phantom. The electrodes 1202a to 1202d are coupled to the bottom surface of section 1102a to 1102d of the clip 1100, respectively, by a layer of conductive adhesive 1404 and/or solder bumps, thereby connecting the electrodes to contact pads 1308a to 1308d through legs 1108a to 1108d, respectively. The bottom electrode 1204 of the die 1200 is coupled to the top surface 1302 of section 1308e of the leadframe 1300 by conductive adhesive layer 1406, thereby coupling the electrode 1204 to the bottom contact pad 1310e.

As with FIGS. 2H and 3H, dashed line 1402 shows the boundaries of encapsulated packaged once overmolded and cut. Removal or cutting of connecting sections 1106 electrically isolates clip sections 1102a, 1102b, 1102c and 1102d from each other, thereby isolating electrodes 1202a, 1202b, 1202c and 1202d and isolating contact pads 1310a, 1310b, 1310c and 1310d.

Figure 4I:
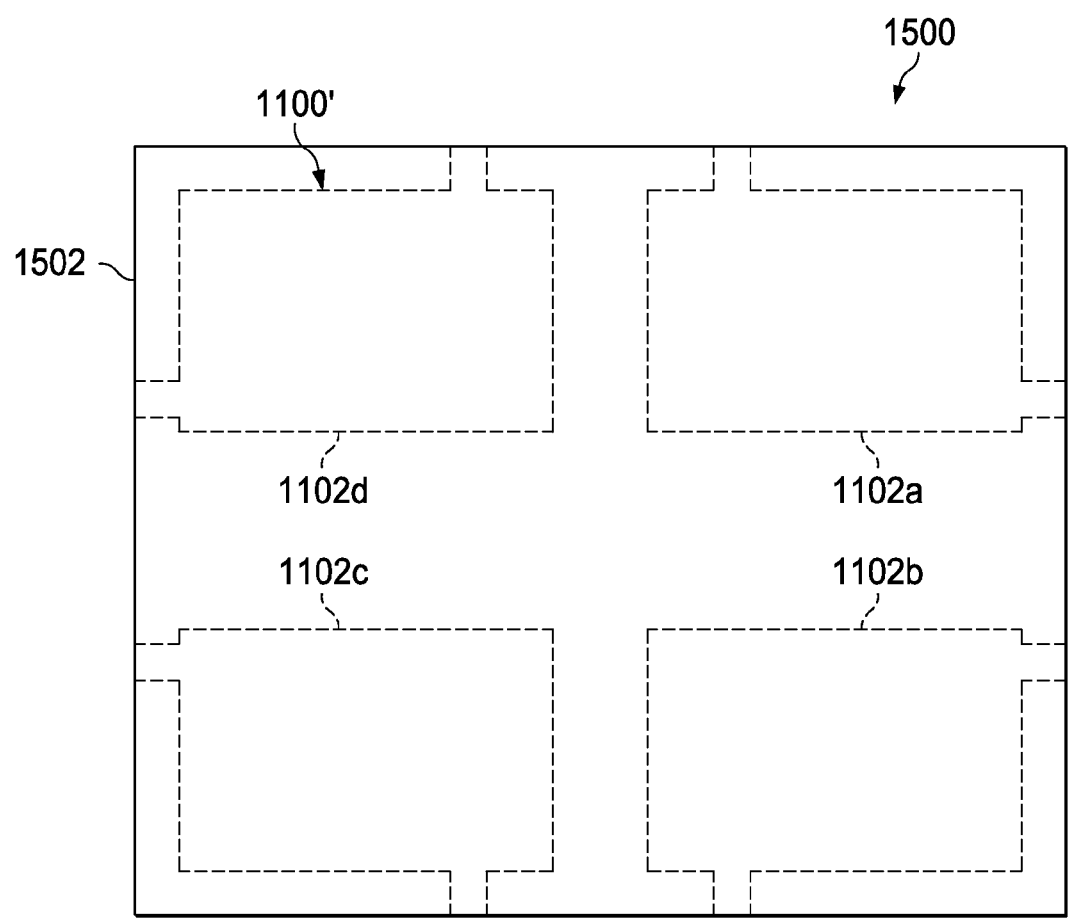

FIG. 4I is a top plan view of a packaged semiconductor device 1500. The assembly 1500 of FIG. 4G is encapsulated within a packaging material, with the I/O contacts 1310a to 1310e exposed at an underside thereof. In an exemplary embodiment, the encapsulating material is a plastic thermosetting material, such as an epoxy resin described above, formed around the assembly 1400 by injection molding, transfer molding or other like method. For purposes of illustration, a clip 1100' is shown in phantom. Clip 1100' is formed by sawing or otherwise removing or cutting connecting sections 1106 of clip 1100, such as after an overmolding process. The edges 1502 of the packaged device 1000 correspond to dashed lines 1402 of FIG. 4H.

FIGS. 7A-7H illustrate an alternative wirebond-less packaged semiconductor device. In this embodiment, as described below, the top surface of the die includes only a single electrical connection while the bottom surface of the die includes multiple electrical connections.

Figure 7A:
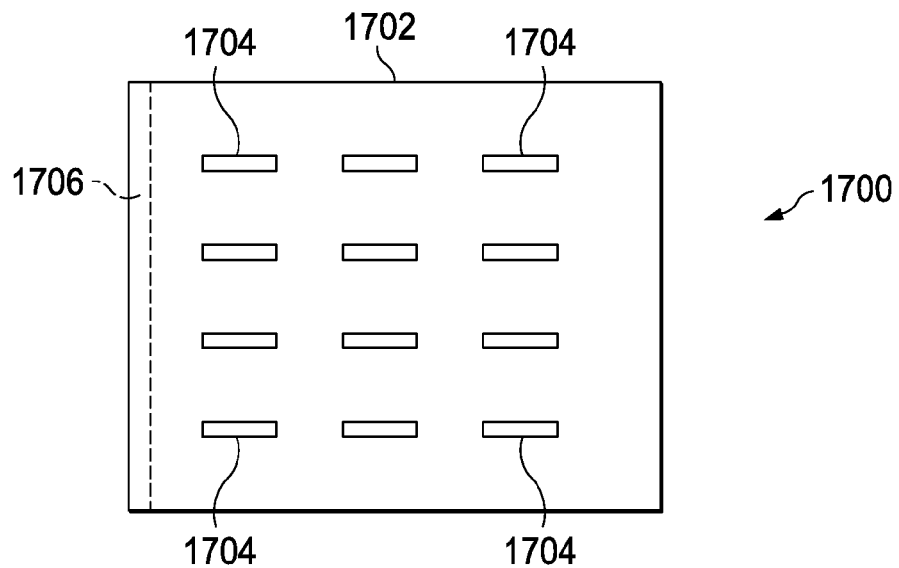
FIGS. 7A-7H illustrate the components of, and formation of, an alternative embodiment of an exemplary packaged semiconductor device.
Figure 7B:
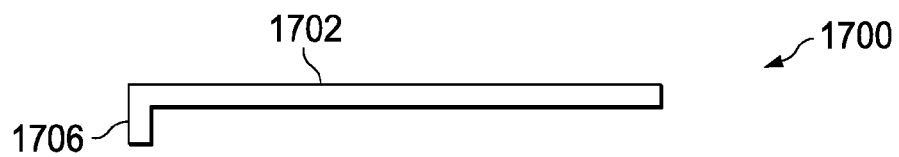

FIG. 7A is a top plan view of a clip 1700 configured to make an electrical connection to a die having a single top electrode, as may be the case, for example, with some RF transistors, Gallium arsenide devices, and LDMOS devices. FIG. 7B is a side view of clip 1700. Clip 1700 includes main body portion 1702. Openings 1704 are provided through the clip 1700 to function as described above. Main body portion 1702 includes one or more downwardly depending legs 1706 located to make electrical contact with the leadframe (described below) in a packaged semiconductor device.

Figures 7C, 7D:
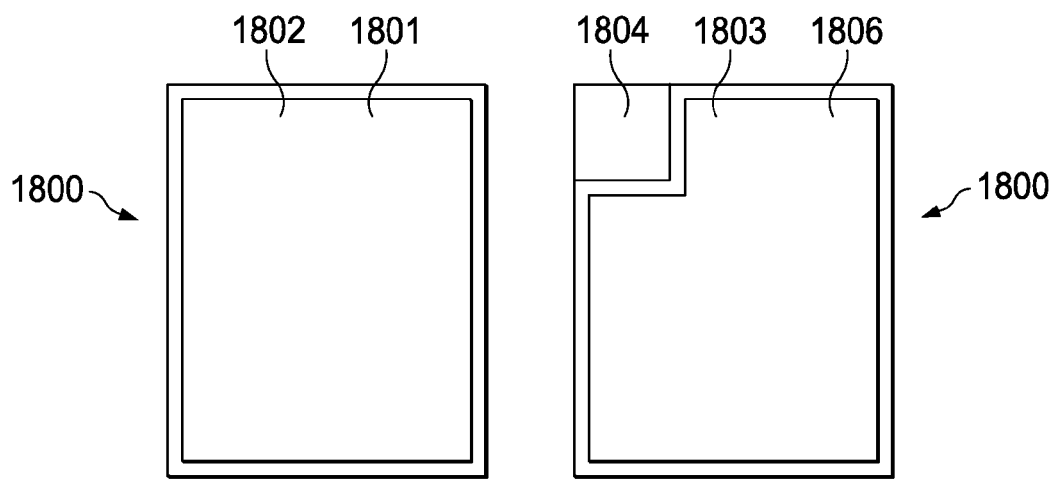

FIG. 7C is a top plan view of an exemplary die 1800 and FIG. 7D is a bottom plan view thereof. Die 1800 includes a top major surface 1801 and a bottom major surface 1803. The top major surface 1801 includes a single electrode 1802 (or group of electrodes that will be shorted by the clip 1700). The bottom surface 1803 includes at least two electrodes, shown as electrodes 1804 ad 1806. In one embodiment, electrode 1804 is a gate electrode, electrode 1806 is a source electrode and electrode 1802 is a drain electrode of a power LDMOS device. Alternatively, electrode 1806 can be a drain electrode and electrode 1802 can be a source electrode.

Figure 7E:
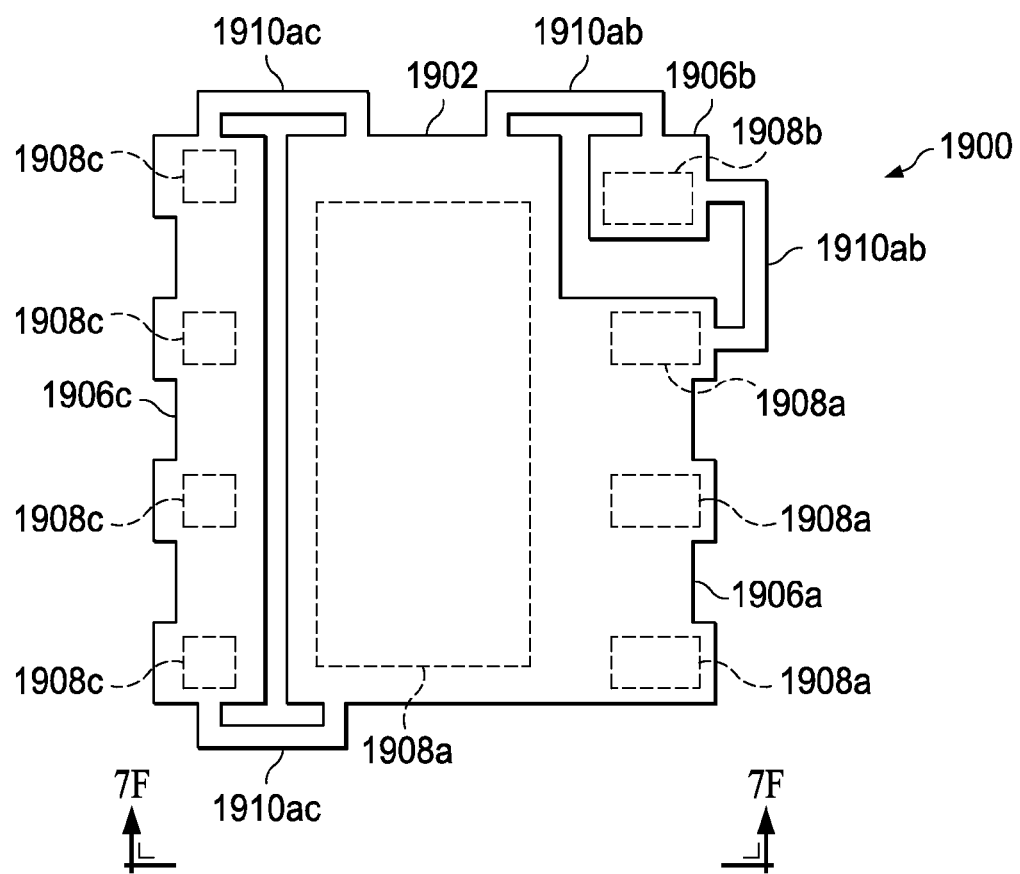
Figure 7F:
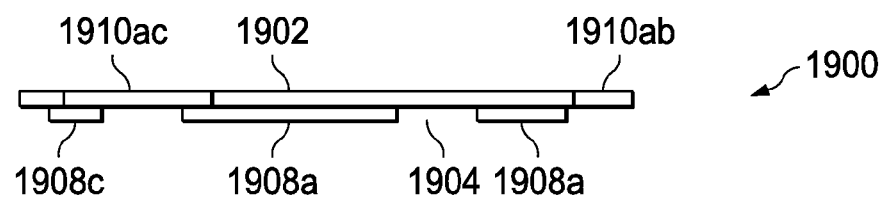

FIG. 7E is a top plan view of a leadframe 1900, and FIG. 7F is a side view thereof taken from the vantage of line 7F-7F, for making electrical connections to the semiconductor die 1800 and clip 1700 discussed above. The leadframe 1900 has a top major surface 1902 and a bottom major surface 1904. The leadframe 1900 is divided into three sections, including a main body section 1906a and peripheral sections 1906b and 1906c, which correspond to electrodes 1806, 1804 and 1802 of die 1800, respectively. The bottom surface of section 1906a defines contacts 1908a, which are shown in phantom in FIG. 7E. The bottom surface of section 1906b defines contact 1908b. Finally, the bottom surface of section 1906c defines contact 1908c. The top major surface of sections 1906a and 1906b is shaped to make contact with the bottom surface 1803 of the die 1800, and thus with electrodes 1804 and 1806, respectively. The top surface of section 1906c is disposed to make contact with leg 1706 of clip 1700, and thus to electrode 1802 of die 1800.

The leadframe 1900 includes one or more protruding connecting sections 1910ac and 1910ab. As shown in FIG. 7E, connecting sections 1910ac connect, at least temporarily, sections 1906a and 1906c to each other, whereas connecting sections 1910ab connect sections 1906a and 1906b to each other. These section are shaped and located such that they can be severed, such as after molding of the assembly, to electrically isolate sections 1906a, 1906b and 1906c, and thus to electrically isolate I/O contacts 1908a, 1908b and 1908c from each other.

Figure 7G:
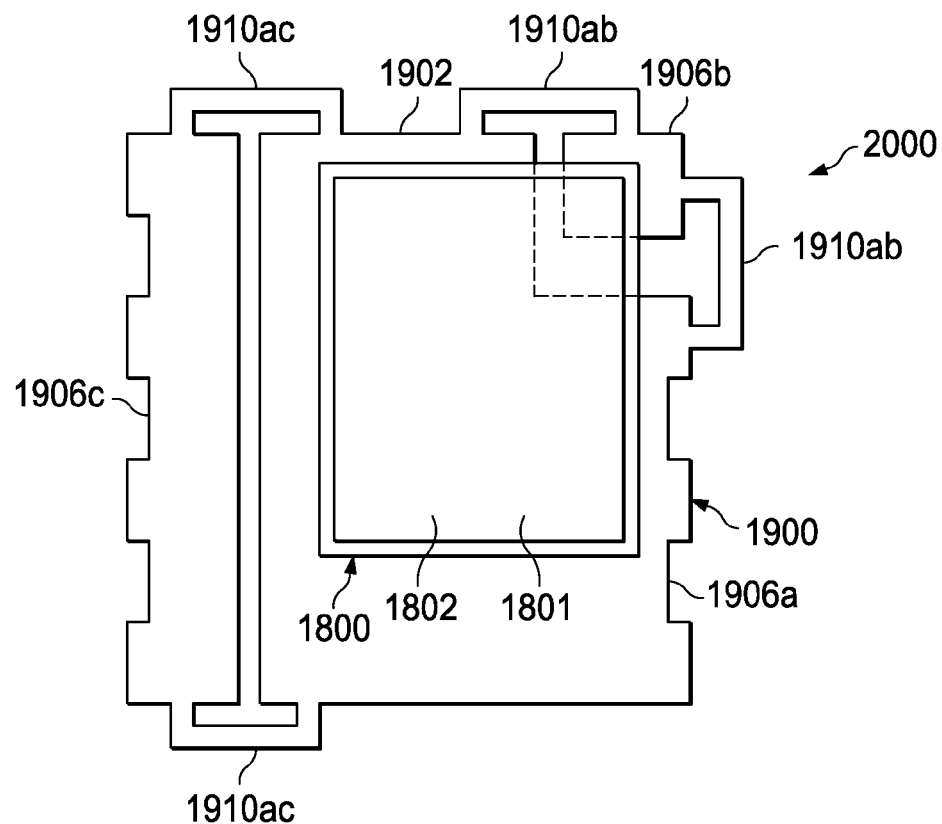

FIG. 7G is a top plan view of a partial assembly 2000 including leadframe 1900 and die 1800 disposed thereover. Clip 1700 is not shown so as to not obscure the features of the die 1800 and leadframe 1900. As can be seen from FIG. 7G, the die 1800 is located over the leadframe 1900 with the electrode 1804 (not shown in FIG. 7G) aligned with section 1906b of clip 1900, and with electrode 1806 aligned with main section 1906a.

Figure 7H:
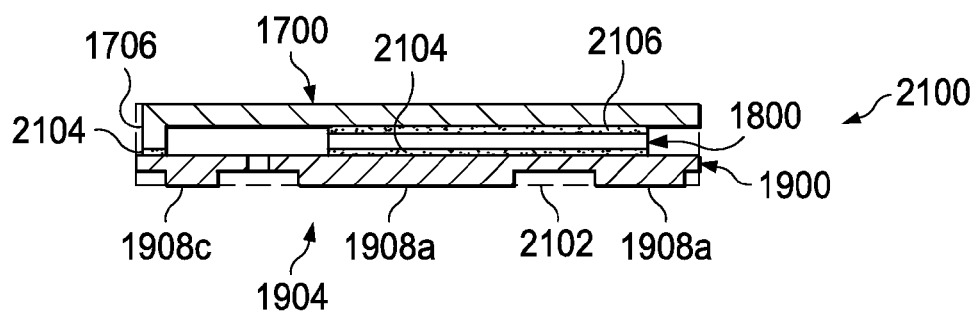

FIG. 7H is a cross-sectional view of a semiconductor device assembly 2100. FIG. 7H shows the assembly after protruding connecting sections 1910ac and 1910ab have been removed to electrically isolate sections 1906a, 1906b and 1906c.

The electrode 1802 of die 1800 is coupled to the bottom surface of clip 1700 by a layer of conductive adhesive 2106 and/or solder bumps, thereby connecting the electrode 1802 to contact pad 1908c through leg 1706. As with the assemblies described above, the contact leg 1706 may also be coupled to the leadframe 1900 by the layer of conductive adhesive 2104. The bottom electrodes 1804 and 1806 of the die 1800 are coupled to the top surface 1902 of the leadframe 1900, specifically to sections 1906c and 1906a, respectively, of the leadframe 1900 by conductive adhesive layer 2104, thereby coupling the electrodes 1804 and 1806 to the bottom contact pads 1908b and 1908a, respectively.

As with FIGS. 2H, 3H and 4H, dashed line 2102 shows the boundaries of an encapsulated packaged once overmolded with a capsulation material and cut. Removal or cutting of connecting sections 1910ab and 1910ac electrically isolates leadframe sections 1910a, 1910b and 1910c from each other, thereby isolating electrodes 1802, 1804 and 1806 of die 1800 and isolating contact pads 1908a, 1908b and 1908c.

While FIGS. 2A-2I, 3A-3I and 4A-4I illustrate embodiments where the leadframe and clip are configured to accommodate a die where the top major surface has multiple electrodes and the bottom major surface has a single electrode, and FIGS. 7A-7H illustrate an embodiment where the top major surface of the die includes a single electrode and the bottom major surface includes multiple electrodes, the connection method and structure therein can be applied to embodiments where both major surfaces of the die have multiple electrodes. In such an embodiment, both the clip and the leadframe would include protruding connecting sections that when cut or severed would electrically isolate sections of the clip and sections of the leadframe. Such an embodiment may be used, for example, where the packaged semiconductor device includes four or more electrically independent I/O contacts.

From the foregoing, a packaging method is provided that is low cost and production friendly. The package itself lacks the complexity of prior art packages, providing a robust package and cost savings. Further, the clip is easily configured to any number of die sizes and electrode configurations. The process and package, therefore, are easily scalable to different I/O and die configurations, providing consequent reductions in development costs and time as well as implementation times for new designs.

In embodiments where all electrical connections are made to the I/O contacts directly from the die to the leadframe or from the clip to the leadframe without wirebonds, there are no wirebond reliability or failure concerns or impedance matching design issues. The repeatability of the electrical connection (e.g., inductance, resistance and capacitance) helps to improve the repeatability of the impedance matching circuit. Electromagnetic coupling between electrodes is also reduced. Parasitic inductances are lower and more repeatable. Further, there is no need for a cleaning procedure before wirebonding, resulting in a simplified process flow and both time and cost savings. Still further, in embodiments, the top metallization layer of the die need only comprise a surface that is solderable and not one that is also wirebondable.

Device performance is also improved, since use of a Cu clip has lower resistance than wirebonds, and thus can conduct more current in high performance devices, replacing the need for not only a wirebond but for multiple wirebonds for carrying the high current.

Still further, the packaging scheme is also multi-chip module (MCM) capable, i.e., the package is easily adapted to providing two or more dies per packaged device. For example, more than one power transistor device can be provided per packaged device. The only modifications that are needed to accommodate this MCM design is to the shape of the clip and leadframe. Such modifications are within the skill of those in the art.

Though not limited thereto, the design described herein is particularly suited to high frequency power LDMOS devices, such as power RF devices. Although the packaged device has been described above principally in connection with a semiconductor die having a bottom drain electrode with isolated gate and source electrodes on an opposite side thereof, the package and packaging method described above are also applicable to other die configurations, such as where the top surface of the die coupled to the clip is configured to have (i) FET drain and gate only, (ii) FET gate, drain and source, (iii) BJT base and emitter only, (iv) BJT base and collector only, (v) BJT base, collector and emitter, (vi) multiple I/O of an integrated circuit, or (vii) anode and cathode of a diode. The bottom exposed surface can be the (i) FET source only, (ii) FET drain only, (iii) BJT emitter only, (iv) BJT collector only, (v) multiple I/O of an integrated circuit, or finally (vi) no electrode at all, i.e., just bare semiconductor substrate material or metallized semiconductor substrate material.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A semiconductor device package, comprising:
   a top surface and a bottom surface parallel to the top surface and four side surfaces perpendicular to the top surface and the bottom surface;
   a leadframe having a flat top side, contacts extending from an etched bottom side parallel to the top side, and edges with severed stubs;
   the contacts downwardly extending and coplanar with of the bottom surface of the package;

the severed stubs of the leadframe extending outwardly and having ends coextensive with the side surfaces of the package;

a semiconductor chip having a top side, affixed to the flat top side of the leadframe with a conductive adhesive;

a metallic clip having a flat top side, a flat bottom side, edges with severed stubs and a downwardly depending leg portion;

the bottom side of the clip affixed to the top side of the semiconductor chip with a conductive adhesive;

the severed stubs of the clip extending outwardly and having ends coextensive with the side surfaces;

the leg portion of the clip affixed to the flat top side of the leadframe; and an encapsulating material encapsulating the leadframe, the semiconductor chip, the metallic clip; forming the top surface, the bottom surface, and the four side surfaces of the device package, exposing the contacts from the bottom surface and the ends of the stubs at the side surfaces of the package.

2. The semiconductor device package of claim 1, in which the clip has two separate portions each affixed to an electrode on a semiconductor chip surface.

3. The semiconductor device package of claim 1, in which the leadframe has two separate portions each affixed to an electrode on a semiconductor chip surface.

4. The semiconductor device package of claim 2, in which the two separate portions of the clip have similar areas.

5. The semiconductor device package of claim 2, in which each of the two separate portions has a downwardly depending leg portion affixed to the flat top side of the leadframe.

6. The semiconductor device package of claim 5, in which the two downwardly depending leg portions are at two opposite edges of the clip.

7. The semiconductor device package of claim 1, in which the top side of the clip is exposed from the encapsulating material.

* * * * *